United States Patent [19]

Komatsu et al.

[11] 4,388,707
[45] Jun. 14, 1983

[54] MEMORY SELECTING SYSTEM

[75] Inventors: Shigeru Komatsu; Kazushi Mizukami; Tsuguji Tachiuchi, all of Yokohama; Kunihiko Nagai, Zushi; Takuo Koyama, Yokohama, all of Japan

[73] Assignee: Hitachi, Ltd., Tokyo, Japan

[21] Appl. No.: 279,071

[22] Filed: Jun. 30, 1981

[30] Foreign Application Priority Data

Jun. 30, 1980 [JP] Japan .................. 55-87869

[51] Int. Cl.³ .............................................. G11C 8/00
[52] U.S. Cl. ........................................... 365/230
[58] Field of Search ............ 365/230, 195, 231; 364/200 MS File

[56] References Cited

U.S. PATENT DOCUMENTS 4,200,919 4/1980 Page et al. ..................... 365/230

FOREIGN PATENT DOCUMENTS 56-41578 4/1981 Japan ..................... 365/231

OTHER PUBLICATIONS

IBM Technical Disclosure Bulletin, vol. 8, No. 6, Nov. 1965, p. 858, Addressing for Expandable Modular Storage, R. J. Carnevale.

Primary Examiner—George G. Stellar
Attorney, Agent, or Firm—Antonelli, Terry & Wands

[57] ABSTRACT

A memory selection system which facilitates the addition of an external memory to a digital processing unit having an internal memory is disclosed. When a plurality of memories have the same addresses and an overlapped address is accessed, priority among the memories having the overlapped address is discriminated to enable only the memory having the highest priority (last attached memory) to be selected for access and to disable the access of the other memories.

4 Claims, 2 Drawing Figures

MEMORY SELECTING SYSTEM

BACKGROUND OF THE INVENTION

1. Field of the Invention

The present invention relates to a priority selecting system for a multi-channel memory of a computer having a removable multi-channel memory.

2. Description of the Prior Art

Recently, as the semiconductor technology has developed, a personal or small business purpose microcomputer having a programmable processing LSI, called a microprocessor (hereinafter referred to as an MPU) has been marketed with a relatively low price. Such a computer is usually called a personal computer or a home computer in which data are processed eight bits in parallel and address information comprises sixteen bits from the standpoints of price, availability and performance. Thus, $2^{16} = 65,536$ addresses can be directly read from or written into the MPU. As the performance is graded up, most of such an address space is used up in many cases. The address space comprises a ROM area in which a program for controlling a hardware of the microcomputer and characterizing a system (hereinafter referred to as a system program) is stored in a read-only memory (hereinafter referred to as a ROM) and a RAM area in which display data are temporarily stored and a user program is stored. Peripheral devices are selected from a variety of devices and programs for controlling an external memory or a control interface, which is sold separately or developed by a user, is also to be stored depending on the peripheral devices connected.

When a system is to be expanded without a margin of the address space, a bank switching method is usually employed. In the bank switching method, a plurality of channel memories connected in parallel to a CPU and a selection circuit for selecting a desired one of the channel memories are provided so that only the channel memory having data written into the selection circuit from the CPU is accessed.

Since this method allows the use of as many channel memories as required connected in parallel, it is an effective way to overcome the shortage of the address space. However, since the channel memories must be switched by a fixed unit area, the channel memories must be switched even when memories having no overlapped address are to be accessed. In addition, in this method, a complex software process such as a step for checking whether a desired address is included in the selected channel memory or a step for determining if the memory is ROM or RAM, is required so that a necessary memory capacity increases and a processing speed is lowered. Furthermore, when an unexpected modification of the program in a masked ROM area or a modification of a controlling software due to a grade-up of pheripheral devices is required, there is no way but reconstructing the masked ROM.

SUMMARY OF THE INVENTION

It is an object of the present invention to provide a memory selection system in which a channel memory determined by a predetermined priority is selected from a plurality of channel memories.

In accordance with the present invention, detection means are provided one for each channel memory to produce a detection signal when an address in the associated channel memory is selected. The detection signal is used as an access enable signal to the associated channel memory and also used as access disable signals to the channel memories having lower priorities than the associated channel memory. The access disable signal is given a higher priority than the access enable signal to control the access enable or access disable conditions of the channel memories so that when the same address in a plurality of channel memories is selected only the channel memory having the highest priority in the predetermined priority order can be accessed.

DETAILED DESCRIPTION OF THE PREFERRED EMBODIMENT

Figure 1:
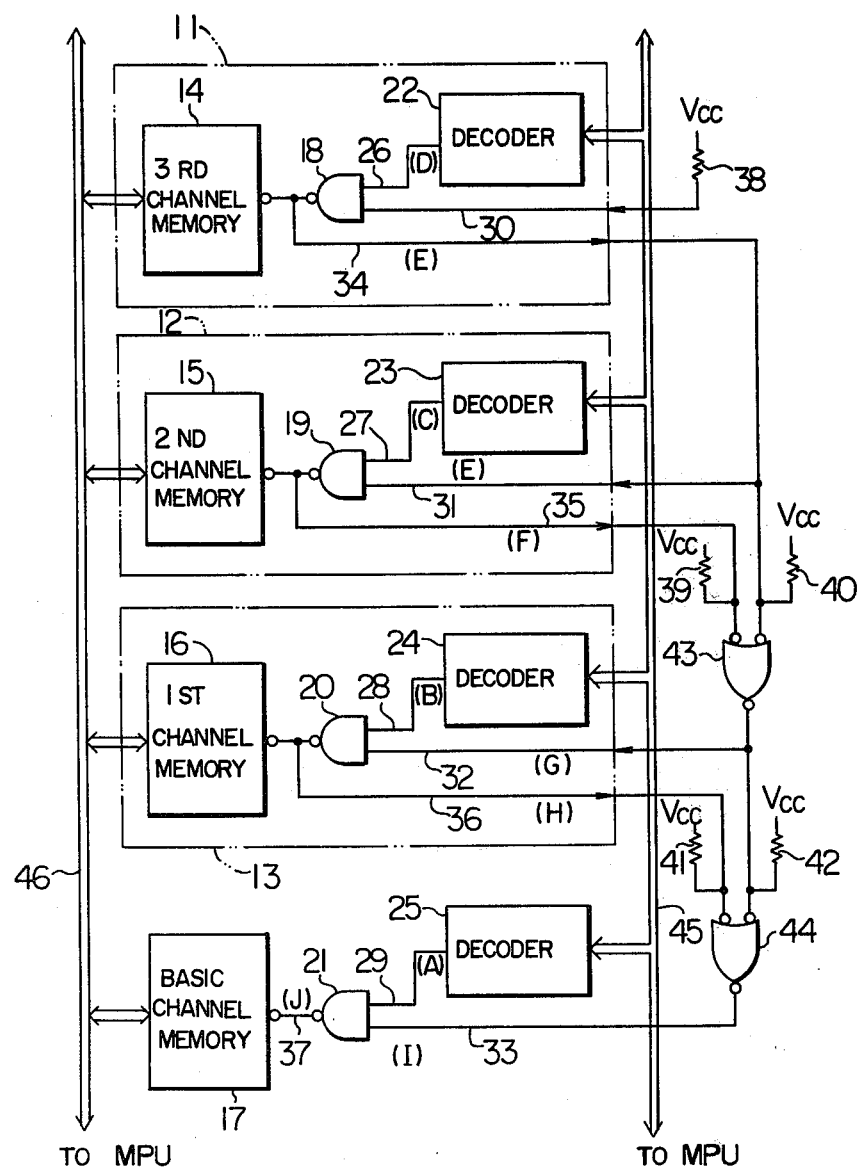
FIG. 1 shows a block diagram of one embodiment of the present invention.
Figure 2:
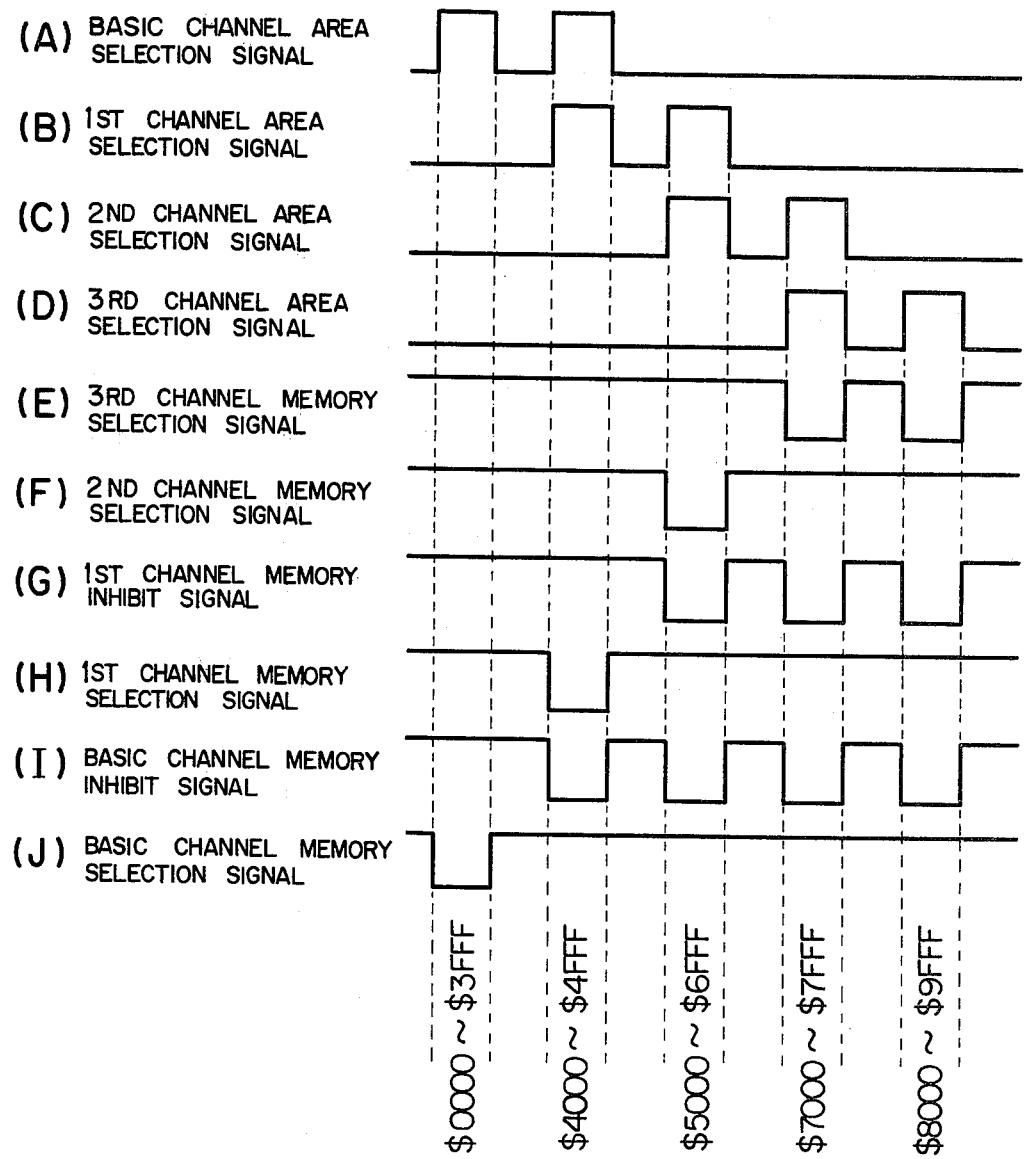
FIG. 2 shows voltage waveforms at various points in FIG. 1.

FIG. 1 shows a block diagram of one embodiment of the present invention. In FIG. 1, broken line blocks 11 to 13 are expanding memory substrates and the rest portion is mounted on a main substrate. Numeral 14 denotes a third channel memory, 15 denotes a second channel memory, 16 denotes a first channel memory, 17 denotes a basic channel memory, 18 to 21 denote NAND circuits, 22 to 25 denote decoders, 26 to 29 denote address area selection signal lines, 30 to 33 denote memory inhibit signal lines, 34 to 37 denote memory selection signal lines, 38 to 42 denote pull-up resistors, 43 and 44 denote negative logic OR circuits, 45 denotes an address bus through which a higher order 8-bit address signal of a 16-bit address signal is transmitted, and 46 denotes a data bus.

A transmission path for lower order eight bits of the 16bit address signal is not shown but it is connected to the channel memories 14 to 17 and an address is determined by the low order eight bits and the selection signals in the memory selection signal lines 34 to 37.

In the present embodiment, only the channel memory 17 is mounted on the main substrate and three connectors which removably connect the expanding memory substrates 11, 12 and 13 are provided on the main substrate. The memories 14 to 17 may comprise different types of memories such as ROM's and RAM's or it comprises one type of memory or it may include a plurality of elements. The memories 14 to 17 are effective (access-enable) only when "L" level signals are present on the memory selection signal lines 34 to 37.

The decoder circuits 22 to 25 decode information on the address bus 45 from the MPU and produce signals on the area selection signal lines 26 to 29, which signals assume an "H" level only for a period during which the areas of the channel memories 14 to 17 are to be accessed and assume an "L" level for the other periods. The NAND circuits 18 and 19 each produces an "L" level output only for a period during which both inputs thereto are of "H" level and produces an "H" level output for the other periods. The negative logic OR circuits 43 and 44 each produces an "L" level output when one of two inputs thereto is of "L" level and produces an "H" level output for the other periods.

Let us assume that the basic channel memory 17 and the first to third channel memories 16, 15 and 14 are provided and there are overlaps of areas among the respective channel memories. For example, 48K bytes out of 64K-bytes address space, i.e., $0000–$4FFF ($ represents hexadecimal notation) and $A000-$FFFF are allocated to the memory 17, 12K bytes of $4000-$6FFF are allocated to the memory 16, 12K bytes of $5000-$7FFF are allocated to the memory 15, 16K bytes of $7000-$AFFF are allocated to the memory 14 so that $4000-$4FFF overlap in the memories 16 and 17, $5000-$6FFF overlap in the memories 15 and 16, $7000-$7FFF overlap in the memories 14 and 15, and $A000-$AFFF overlap in the memories 14 and 17. In the present example, the output of the decoder curcuit 22 assumes the "H" level for the address signals for $7000-$AFFF and assumes the "L" level for the other address signal, the output of the decoder circuit 23 assumes the "H" level for the address signals for $5000-$7FFF and assumes the "L" level for the other address signals, the output of the decoder circuit 24 assumes the "H" level for the address signals for $4000-$6FFF and assumes the "L" level for the other address signals, and the output of the decoder circuit 25 assumes the "H" level for the address signals for $0000-$4FFF and $A000-$FFFF and assumes the "L" level for the other address signals. Accordingly, the addresses $4000-$4FFF, $5000-$6FFF, $7000-$7FFF and $A000-$AFFF overlap in the two memories. This is illustrated in FIGS. 2(A) to (D), which show the output levels of the decoder circuits 25-22 as channel area selection signals, although the output levels for the address signals for $A000-$FFFF are not shown.

The channel area selection signal waveforms (D)-(A) each has two "H" level periods. In the first "H" level period, only the associated channel is selected or the channel having a lower priority than the associated channel is selected simultaneously in overlap, and in the second "H" level period (except FIG. 2(D)), the associated channel and the channel having a higher priority than the associated channel are simultaneously selected.

The third channel area selection signal (D) is applied to the NAND circuit 18. Another input signal to the NAND circuit 18 is held at the "H" level by the pull-up resistor 38 so that the output signal of the NAND circuit 18 or the third channel memory selection signal (E) is an inversion of the third channel area selection siganl (D). During the "L" level period of the third channel memory selection signal (E), the third channel memory 14 is enabled to read and write. The third channel memory selection signal (E) is directly applied to the NAND circuit 19 as a second channel inhibit signal. Another input to the NAND circuit 19 is NANDed with the second channel area selection signal (C) and the resulting output as shown by the second channel memory selection signal (F) enables the second channel memory 15 only for a period during which the second channel memory 15 is selected and the third channel memory 14 is not selected. The second channel memory selection signal (F) is applied to the negative logic OR circuit 43 which produces a first channel inhibit signal (G) which is of "L" level for a period during which either one of the second channel inhibit (i.e. third channel memory selection) signal (E) or the second channel memory selection signal (F) is of "L" level. The signal (G) functions to inhibit the first channel memory 16 for a period during which either the third channel memory or the second channel memory is enabled. Accordingly, a first channel memory selection signal (H) derived by NANDing the first channel area selection signal (B) in FIG. 2 with the first channel inhibit signal (G) assumes the "L" level only in one period like in the case of the second channel. Similarly, in the basic channel, the output signal (basic channel memory inibit signal) (I) of the negative logic OR circuit 44 which assumes the "L" level for a period during which one of the first, second and third channels is selected is NANDed with the basic channel area selection signal (A) in the NAND circuit 21 to produce a basic channel memory selection signal (J).

As a result, when the channel memories 14-17 occupy the same area, a priority order is given to the third channel, the second channel, the first channel and the basic channel in this order. Accordingly, the memory 14 is used for $7000-$AFFF, the memory 15 is used for $5000-$6FFF, the memory 16 is used for $4000-$4FFF and the memory 17 is used for $0000-$3FFF and $B000-$FFFF.

In the above example, it was assumed that all of the channel memory substrates are present. The operation where one or more channel memory substrate is not present is now explained below.

For example, when the third channel memory substrate 11 is not mounted, the third channel memory selection signal (E) is maintained at the "H" level by the pull-up resistor 40. Since the second channel memory inhibit signal (E) is also maintained at the "H" level, the second channel area selection signal (C) has no restriction imposed thereon and it is merely inverted by the NAND circuit 19 and the inverted signal is applied to the second channel memory 15 as the second channel memory selection signal (F). The subsequent operation is same as that for the case when all of the channel memories are present. That is, the priority is given to the second channel, the first channel and the basic channel in this order.

Similarly, when the second channel memory substrate 12 is not present, the second channel memory selection signal (F) is maintained at the "H" level by the pull-up resistor 39. Accordingly, the first channel memory inhibit signal (G) which is the output of the negative logic OR circuit 43 has the same waveform as the third channel memory selection signal (E) and the priority is given in the order of the third channel, the first channel and the basic channel.

Similarly, when the first channel memory substrate 13 is not present, the priority is given in the order of the third channel, the second channel and the basic channel.

When two channel memory substrates, for example, the third channel memory substrate 11 and the second channel memory substrate 12 are not present, the output of the negative logic OR circuit 43 (first channel memory inhibit signal (G)) is maintained at "H" level by the pull-up resistors 39 and 40. As a result, the first channel memory 16 is selected for all areas specified by the first channel area selection signal (B) and the basic channel area selection signal (A) is inhibited by the negative logic OR circuit 44 for a period during which the memory 16 is selected. Accordingly, the first channel memory 16 is selected with a higher priority than the basic channel memory 17.

The above is equally applicable to a case where any two of the memory substrates 11, 12 and 13 are not present, and when the area overlaps in the existing channels, the priority is given in the order of the third, second, first and basic channels.

When only one channel is present, for example, only the basic channel memory 17 is present, the both inputs to the negative logic OR circuit 43 are of "H" level and hence the ouput thereof or the first channel inhibit signal (G) is also of "H" level. Since the both inputs to the negative logic OR circuit 44 are of "H" level, the output thereof or the basic channel memory inhibit signal (I) is always of "H" level and the basic channel memory 17 is enabled for the all areas selected by the decoder circuit 25. This is equally applicable to a case where any single one of the channel memories other than the basic memory is present. While the four channels have been shown in the present embodiment, the priority is given in a similar manner when more than four or less than four channels are used.

In accordance with the present invention, when the areas in the plurality of channel memories 14–17 are read or written, the channel having the highest priority in the predetermined priority order is selected from the existing channels. Accordingly, a complex process such as software checking of the presence of the channel, channel switching or channel reset is not necessary and a memory space for storing a program for executing such a process can be elminated. In addition, since no complex process as described above is necessary, a processing speed is increased. By mounting a programmable ROM which stores only the contents of modification in the higher priority channel, the address-by-address modification of a portion of the program in the masked ROM of the existing channel and the modification of the program for controlling the connected peripheral devices can be readily attained without reconstructing the masked ROM. The ROM area can be readily decreased to increase the RAM area or vice versa. By merely changing the insertion positions of the channel memory substrates, the priority order can be altered. Accordingly, the present invention has more versatility and expandability than the prior art bank switching method.

We claim:

1. A memory selection system comprising;
   (a) a plurality of memories, each having a control terminal to which a control signal is applied, each of said memories assuming an access enable state or an access disable state in response to said control signal applied thereto,
   (b) a plurality of detection means, one for each of said memories, each of said detection means having an output terminal for producing a detection signal when an address in the associated memory is designated, and
   (c) control means having a plurality of pairs of input and output terminals, one pair for each of said memories and said detection means, each of said plurality of pairs having a predetermined priority with respect to others, the input terminal and the output terminal of each of said plurality of pairs being connected to the output terminal of the associated detection means and the control terminal of the associated memory, respectively, whereby when more than one of said terminal pairs receive the detection signal, only the terminal pair having the highest priority among said more than one terminal pairs produces an access enable signal at the output terminal as said control signal and the other terminal pairs having lower priorities produce an access disable signal at the output terminals as said control signals.

2. A memory selection system according to claim 1 wherein said control means produces the access disable signals at the output terminals of the terminal pairs which have not received the detection signals and produces the access enable signal at the output terminal of the terminal pair which has received the detection signal with the terminal pair having a higher priority receiving no detection signal, and produces the access disable signal at the output terminal of the terminal pair which has received the detection signal with the terminal pair having the high priority receiving no detection signal./

3. A memory selection system according to claim 1 or 2 wherein said control means includes:
   a plurality of signal generating means, one for each of said terminal pairs, for producing the access enable signals or the access disable signals at the respective output terminals of said terminal pairs depending on whether the input terminals of said terminal pairs have received the detection signal or not, and
   inverting means responsive to the access enable signal of each address produced at the output terminal of the terminal pair having the higher priority to cause the output terminals of all of the terminal pairs having lower priorities to produce the access disable signals.

4. A memory selection system comprising:
   first and second memories;
   first and second detection means for producing detection signals when addresses in said first and second memories are designated, respectively;
   first and second control means for enabling said first and second memories for access, respectively, when said first and second detection means produce said detection signals, respectively; and
   third control means responsive to the detection signal from said first detection means to disable said second memory for access independently of the presence or absence of the detection signal from said second detection means.

* * * * *